(12) United States Patent
Bessonov et al.

(10) Patent No.: US 9,978,940 B2
(45) Date of Patent: May 22, 2018

(54) MEMRISTOR AND METHOD OF PRODUCTION THEREOF

(71) Applicant: Provenance Asset Group LLC

(72) Inventors: Alexander Alexandrovich Bessonov, Moscow (RU); Dmitrii Igorevich Petukhov, Perm (RU); Marina Nikolaevna Kirikova, Moscow (RU); Marc Bailey, Cambridge (GB); Tapani Ryhanen, Helsinki (FI)

(73) Assignee: Provenance Asset Group LLC, Essex, CT (US)

( * ) Notice: Subject to any disclaimer, the term of this patent is extended or adjusted under 35 U.S.C. 154(b) by 0 days. days.

(21) Appl. No.: 15/305,205

(22) PCT Filed: Oct. 23, 2014

(86) PCT No.: PCT/RU2014/000799
§ 371 (c)(1),
(2) Date: Oct. 19, 2016

(87) PCT Pub. No.: WO2015/167357
PCT Pub. Date: Nov. 5, 2015

(65) Prior Publication Data
US 2017/0047512 A1 Feb. 16, 2017

(30) Foreign Application Priority Data
Apr. 30, 2014 (WO) ................ PCT/RU2014/000316

(51) Int. Cl.
*H01L 45/00* (2006.01)
*H01G 7/06* (2006.01)

(52) U.S. Cl.
CPC .......... *H01L 45/1233* (2013.01); *H01G 7/06* (2013.01); *H01L 45/08* (2013.01);
(Continued)

(58) Field of Classification Search
CPC . H01L 45/1233; H01L 45/08; H01L 45/1253; H01L 45/1273; H01L 45/141;
(Continued)

(56) References Cited

U.S. PATENT DOCUMENTS 7,846,807 B2 12/2010 Tang et al.
8,294,132 B2 10/2012 Miao et al.
(Continued)

FOREIGN PATENT DOCUMENTS

EP 2141753 A2 1/2010
WO 1997/005665 A1 2/1997
(Continued)

OTHER PUBLICATIONS

International Search Report and Written Opinion received for corresponding Patent Cooperation Treaty Application No. PCT/RU2014/000799, dated Jan. 4, 2015, 15 pages.
(Continued)

*Primary Examiner* — Cheung Lee
*Assistant Examiner* — Stephen C Smith
(74) *Attorney, Agent, or Firm* — Dinsmore & Shohl LLP

(57) ABSTRACT

A device is disclosed which comprises a first electrode (101), a second electrode (104) spaced from the first electrode, a switching region (102) positioned between the first electrode and the second electrode, and an intermediate region (103) positioned between the switching region and the second electrode, wherein the intermediate region is in electrical contact with the switching region and the second electrode. Preferably, the intermediate region comprises metal nanowires (105) in a polymer matrix, and the device is a memristor or a memcapacitor. In the latter case, the switching region comprises a conductive material (106) and an insulating material (107).

18 Claims, 7 Drawing Sheets

(52) U.S. Cl.
CPC ...... *H01L 45/1253* (2013.01); *H01L 45/1273* (2013.01); *H01L 45/141* (2013.01); *H01L 45/142* (2013.01); *H01L 45/146* (2013.01); *H01L 45/16* (2013.01); *H01L 45/1608* (2013.01); *H01L 45/1641* (2013.01)

(58) Field of Classification Search
CPC ..... H01L 45/142; H01L 45/146; H01L 45/16; H01L 45/1608; H01L 45/1641; H01G 7/06
See application file for complete search history.

(56) References Cited

U.S. PATENT DOCUMENTS

| | | | |
|---|---|---|---|
| 8,298,891 | B1 | 10/2012 | Chiang et al. |
| 8,502,343 | B1 | 8/2013 | Jha et al. |
| 2010/0117051 | A1 | 5/2010 | Tian et al. |
| 2011/0017977 | A1* | 1/2011 | Bratkovski ............ H01L 45/08 257/14 |
| 2011/0180775 | A1* | 7/2011 | Lin ...................... H01L 45/085 257/4 |
| 2011/0186799 | A1 | 8/2011 | Kai et al. |
| 2011/0266513 | A1 | 11/2011 | Williams et al. |
| 2011/0309321 | A1 | 12/2011 | Yang et al. |
| 2012/0211719 | A1* | 8/2012 | Haimoto ............ H01L 45/085 257/4 |
| 2012/0217463 | A1 | 8/2012 | Hwang |
| 2013/0099187 | A1* | 4/2013 | Pickett ................ H01L 27/26 257/2 |
| 2013/0242637 | A1 | 9/2013 | Yang et al. |

FOREIGN PATENT DOCUMENTS

| | | |
|---|---|---|
| WO | 2002/021542 A1 | 3/2002 |
| WO | 2006/003620 A1 | 1/2006 |
| WO | 2011/028208 A1 | 3/2011 |
| WO | 2013/019228 A1 | 2/2013 |
| WO | 2013/070307 A1 | 5/2013 |

OTHER PUBLICATIONS

Yang et al., "Memristive Devices for Computing", Nature Nanotechnology, Jan. 13-24, 2013, 10 pages.
Oblea et al., "Silver Chalcogenide Based Memristor Devices", The 2010 International Joint Conference on Neural Networks, Jul. 18-23, 2010, 3 pages.
Li et al., "Ultrafast Synaptic Events in a Chalcogenide Memristor", Scientific Reports, vol. 3, Article No. 1619, Apr. 8, 2013, pp. 1-7.
Adhikari et al., "Three Fingerprints of Memristor", IEEE Transactions on Circuits and Systems—I: Regular Papers, vol. 60, No. 11, Nov. 2013, pp. 3008-3021.
"Tungsten oxide nanopowder, WO3 nano-materials", NaBond, Retrieved on Oct. 14, 2016, Webpage available at : http://www.nabond.com/Tungsten_oxide_nanopowder.html.
Kuzum et al., "Synaptic Electronics: Materials, Devices and Applications", Nanotechnology, vol. 24, No. 38, Sep. 2, 2013, 382001 pages.
Kim et al., "Dependence of the Switching Characteristics of Resistance Random Access Memory on the Type of Transition Metal Oxide; Tio2, Zro2, and Hfo2", Journal of the Electrochemical Society, Mar. 2, 2011, 3 pages.
"Memristors—A Revolution on the Horizon", UCDAVIS Zimani, Retrieved on Oct. 14, 2016, Webpage available at : http://www.physics.ucdavis.edu/zimanyi/talks/memristor-2011.pdf.
Wang et al., "Electrode Materials for Ge2sb2te5-based Memristors", Journal of Electronic Materials, vol. 41, No. 12, Dec. 2012, pp. 3417-3422.
International Search Report and Written Opinion received for corresponding Patent Cooperation Treaty Application No. PCT/RU2014/000316, dated Apr. 1, 2015, 16 pages.
Tanaka et al., "Electrical Switching Phenomena in a Phase Change Material in Contact With Metallic Nanowires", Japanese Journal of Applied Physics, vol. 41, Dec. 15, 2002, pp. 1443-1445.

* cited by examiner

MEMRISTOR AND METHOD OF PRODUCTION THEREOF

RELATED APPLICATION

This application was originally filed as PCT Application No. PCT/RU2014/000799 filed Oct. 23, 2014, which claims priority benefit to PCT Application No. PCT/RU2014/000316 filed Apr. 30, 2014.

TECHNICAL FIELD

The present application relates to microelectronics. In particular, the present application relates to variable resistance devices and methods of production thereof.

BACKGROUND

Neuromorphic electronics that mimic the working principles of neuron and synapse behavior may change the computing paradigm, providing cognitive data processing capabilities. Artificial neuromorphic systems are highly productive due to parallel computing and thus tolerant to defects in circuits, consume low energy due to short spike-like electric pulses, and have reduced circuit complexity due to two terminal structures. Analog adaptive electronics may outperform currently used digital computing platforms in tasks such as image recognition, classification, cognitive computation and sensor data processing.

The memristor, a basic component of neuromorphic systems, is an electrical resistance switch with the capability to retain a state of resistance based on the history of applied voltage and flowing current. Memristor devices can store and process information in contrast to conventional integrated circuit technology where switching transistors and memory are separated. There are several classes of memristors, for example two-terminal vertical-stack, two-terminal planar, or three-terminal resistance switches. Based on the switching mechanism the materials can be grouped into two main categories—chemical and physical switches. The first class includes ionic switching materials where anions or cations are considered to be the mobile species utilizing the principles of redox reactions and nanoionics. Anion motion induced by an electric field leads to valence changes of the metal causing the resistance change of the material (such as metal oxides, metal nitrides, metal iodides and metal chalcogenides), while cation-based devices are driven by electrochemically active metals such as copper or silver with the capability of forming an atomic bridge between electrodes. A second category of memristors based only on physical changes include devices relying on magnetic, ferroelectric, electron/hole trapping and phase-change processes. However, both chemical and physical switching mechanisms can also be realized in a single device.

SUMMARY

In this section, the main embodiments of the present invention as defined in the claims are described and certain definitions are given.

According to a first aspect of the present invention, a device is disclosed. The device comprises: a first electrode; a second electrode spaced from the first electrode; a switching region positioned between the first electrode and the second electrode, the switching region comprising one or more materials; and an intermediate region positioned between the switching region and the second electrode, wherein the intermediate region is in electrical contact with the switching region and the second electrode.

The device according to the embodiment may be a variable resistance device, for example a memristive device. A memristive device is a device that has a current-voltage (I-V) pinched-hysteresis loop that has a frequency dependent size. The first and second electrodes may comprise any conductive material. The intermediate region is positioned between the switching layer and the second electrode. As it is clear to a skilled person, the electrodes are numbered as "first" and "second" electrodes for clarity purposes only. They may be interchangeable, have similar or different conductive properties and comprise the same or different materials. In the production of this device the electrodes may be deposited in any order.

The device according to the embodiment may be a variable capacitance device.

The intermediate region may be advantageous in providing electrical contact with the switching region and the second electrode, while at the same time preventing unwanted electrical contact between the first and the second electrodes.

According to an embodiment, the device is a memristor.

According to an embodiment, the switching region is in electrical contact with the first electrode via physical contact with the first electrode, and in electrical contact with the second electrode via physical contact with the intermediate region.

The physical contact can also mean a physical proximity sufficient for establishment of an electrical contact.

According to an embodiment, the switching region comprises one or more materials selected from the group of: transition metal dichalcogenides (TMD), partially oxidized TMD, fully oxidized transition metal oxides (TMO) and graphene-like materials.

The TMD materials may be selected from the group of materials with the following chemical formulas: $WX_2$, $MoX_2$, $ScX_2$, $TiX_2$, $HfX_2$, $ZrX_2$, $VX_2$, $CrX_2$, $MnX_2$, $FeX_2$, $CoX_2$, $NiX_2$, $NbX_2$, $TcX_2$, $ReX_2$, $PdX_2$ and $PtX_2$ wherein "X" may be S, Se or Te. The TMO materials may be selected from the group of materials with the following chemical formulas: $WO_n$, $MoO_n$, $ScO_n$, $TiO_n$, $HfO_n$, $ZrO_n$, $VO_n$, $CrO_n$, $MnO_n$, $FeO_n$, $CoO_n$, $NiO_n$, $NbO_n$, wherein "n" has a value of 2 or 3. The graphene-like materials may be selected from the group including graphene oxide and materials with the following chemical formulas: hexagonal BN, AlN, GaN, InN, InP, InAs, BP, BAs, GaP. All of the above materials may be provided into the switching region as combinations of few-layer flakes or other few-layer structures. As a result, the switching region may comprise one or more few-layer materials selected from the groups listed above. For the purposes of this specification, the term "few-layer" refers to a layered structure with 1-10 layers of atoms. The material may be an insulator, a p-type or an n-type semiconductor.

It is clear to a skilled person that the switching region can comprise these materials in any combination, e.g. in homogenous composites or as separate hybrid layers. In an exemplary embodiment, the switching regions comprise materials in a stack.

According to an embodiment, the switching region has a thickness between 10 and 1000 nanometers.

According to an embodiment, the intermediate region comprises: metal nanowires (NW), polymers or a combination thereof. Metal nanowires may have a solids content in the range of 1-50 weight percent.

The materials according to this embodiment may be used in any combination or individually. For example, the intermediate region may comprise a conducting polymer selected from the group of: polyanilines (PANI), poly(pyrrole)s (PPY), poly(thiophene)s (PT), poly(3,4-ethylenedioxythiophene) (PEDOT), poly(p-phenylene sulfide) (PPS), poly (acetylene)s (PAC), poly(p-phenylene vinylene) (PPV). Alternatively, but not limited to, the intermediate region may comprise metal nanowires embedded in an insulating polymer matrix. The insulating polymer may be acrylic, polyurethane, polysiloxane, epoxy resins, or other suitable organic media.

According to an embodiment, the intermediate region is in electrical contact with the second electrode and with the switching region via one or more electrical contact points.

In an embodiment, these contact points may be sporadic. For example, if metal nanowires are used in the intermediate region, they can provide sporadic contact points throughout interfaces of the intermediate region. Such sporadic electrical contacts can support nanoscale ionic motion channels. The resistance switching may thereby be localized to a small area of the interface.

The intermediate region may serve as a physical barrier providing sporadic contact points or as a barrier for charge carriers tuning the work function of the second electrode and thus changing the Schottky barrier height.

According to an embodiment, the elements of the device are arranged to form a vertical stack. For example, the elements of the device may be arranged to form a vertical stack few-layer based memristor.

In an embodiment, the device may have a first interface between the first electrode and the switching region, and a second interface between the switching region and the intermediate region. One interface of the device may be an ohmic interface with a large density of dopants (e.g. defects or structural imperfections) while the other interface may be electrically resistive with fewer dopants. A large fraction of applied voltage can drop on the resistive interface providing switching, whereas the ohmic interface always remains highly conductive. The functioning of a resistive switch can be based on the Schottky barrier at the interface insulator/metal or semiconductor/metal. The resistance switching mechanism may rely on nano-ionic transport processes associated with redox reactions, or charge trapping/detrapping, or a mixture of these.

According to an embodiment, the switching region comprises one or more defects including structural defects, pores and/or cavities. For example, the defects may be formed during the deposition or at a later stage, e.g. by partial or full oxidation of the materials. Structural defects may affect the switching properties and be advantageous in a memristive device. Stoichiometry of the materials can be further disturbed by a number of different techniques including thermal annealing, UV treatment, electron beam bombardment, etc. In an embodiment, the structural defects may improve ionic motion involving the oxygen anions.

According to an embodiment, the intermediate region at least partially fills the pores and/or cavities in proximity to the interface between the intermediate region and the switching region. The pores and/or cavities are fabrication defects that occur during deposition or at a later stage and may affect the functioning of the device negatively.

In an exemplary embodiment, the intermediate region can comprise metal nanowires embedded in an insulating polymer matrix and fill the cavities or pores of the switching region near the interface of the two regions. This provides for sporadic contact points by means of the metal nanowires.

According to an embodiment, the switching region comprises a conductive material and an insulating material, and the device is a variable capacitance device. The device according to an embodiment may be a memcapacitor. Memcapacitor means an electrical capacitive switch with a capability to retain a state of capacitance based on the history of applied voltage and passed charge. The variable capacitance device may also have a variable resistance.

In an embodiment, the insulating material is positioned in the switching region so that at least part of the insulating material is in physical contact with the intermediate region. Physical contact can also mean a physical proximity sufficient for establishment of an electrical contact. The insulated material may be positioned on the top of the switching region.

According to an embodiment, the insulating material comprises a material selected from the group of: insulating transition metal dichalcogenides, transition metal oxides and graphene-like materials.

According to an embodiment, the conductive material comprises a material selected from the group of: conductive transition metal dichalcogenides, transition metal oxides and graphene-like materials.

According to an embodiment, the switching region is partially oxidized. In the embodiment the oxidized part of the switching region comprises the insulating material, and the remaining part of the switching region comprises the conductive material.

According to an embodiment, the oxidized part of the switching region is at least partially in physical contact with the intermediate region.

According to an embodiment, the intermediate region comprises nanowires embedded in an organic material. The nanowires may comprise metal nanowires, metal oxide nanowires or carbon-based nanowires. In an alternative embodiment, other structures such as nanoparticles, nanorods, nanoplates etc. may be used instead of the nanowires. The organic material may comprise, for example, polymer, silicone or resin.

In an embodiment, the intermediate region is in electrical contact with the second electrode and with the insulating material of the switching region via one or more electrical contact points. The contact points may be sporadic.

In an embodiment, elements of the device are arranged to form a vertical stack.

According to a second aspect of the present invention, a method is disclosed. The method comprises: providing a first electrode; depositing on the first electrode a switching region comprising one or more materials; depositing on the switching region an intermediate region comprising metal nanowires and/or polymers; and depositing on the intermediate region a second electrode.

The method according to this embodiment may be, but not limited to, a method for producing or fabricating a variable resistance device, or a method for producing or fabricating a memristor.

As it is clear to a skilled person, the first and second electrodes are numbered only for clarity purposes. According to an alternative embodiment, the method comprises: providing a first electrode; depositing on the first electrode an intermediate region comprising metal nanowires and/or polymers; depositing on the intermediate region a switching region comprising one or more materials; and depositing on the switching region a second electrode.

The one or more materials according to the method may be, but not limited to, few-layer materials.

According to an embodiment, the method further comprises providing a substrate, wherein the first electrode is provided by depositing said first electrode on the substrate.

In other words, according to this embodiment a substrate is provided, and the first electrode is deposited on the substrate, followed by depositing a switching region on the first electrode etc. The substrate can be either rigid or flexible including plastic foils.

According to an embodiment, the method further comprises at least partially oxidizing the switching region comprising one or more materials prior to depositing an intermediate region.

Partial or full oxidation may be performed to modify the interface between the one or more materials of the switching region and the intermediate region. A less conductive oxide layer may be formed at the interface of the switching region by oxidation, and thus the electronic switching properties of the resulting device can be improved. Since, for example, transition metal oxides can be difficult to provide as a material to be deposited, the method according to this embodiment may be beneficial for producing such oxides in-situ during deposition.

Partial oxidation may be performed to form an insulating material on top of the switching region.

In an exemplary embodiment, the method comprises at least partially oxidizing the switching region at various temperatures in a range between 100° C. and 500° C.

According to an embodiment, the switching region comprising one or more materials is deposited on the first electrode by at least one of the following deposition techniques: spray-coating, slot-die coating, inkjet printing, thin film transfer, spreading technique, CVD and sputtering.

According to an embodiment, the intermediate region comprising metal nanowires and/or polymers is deposited on the switching region by dispensing, drop-casting, screen printing, offset printing, gravure printing, flexography, inkjet printing, and the similar techniques.

According to an embodiment, the first and second electrodes are deposited by at least one of the following deposition techniques: sputtering, CVD, PVD and printing. In this embodiment, a substrate is provided and the first electrode is deposited on the substrate.

According to an embodiment, at least partially oxidizing the switching region comprises oxidizing the switching region in an environment comprising oxygen by at least one of the following techniques: thermal annealing, laser, plasma, and xenon flash lamp treatment.

In an embodiment, depositing the switching region comprises depositing on the first electrode a conductive material and depositing on the conductive material an insulating material.

As it is clear to a skilled person, the methods according to these embodiments are not limited to the mentioned techniques, and they are indicated for exemplary purposes only.

According to a third aspect of the present invention, an apparatus is disclosed. The apparatus comprises: at least one processor; at least one memory coupled to the at least one processor, the at least one memory comprising program code instructions which, when executed by the at least one processor, cause the apparatus to perform the methods according to any of the abovementioned embodiments.

BRIEF DESCRIPTION OF THE DRAWINGS

For a more complete understanding of example embodiments of the present invention, reference is now made to the following descriptions taken in connection with the accompanying drawings in which.

DETAILED DESCRIPTION OF THE EMBODIMENTS

Exemplary embodiments of the present invention and its potential advantages are understood by referring to FIGS. 1 through 4 of the drawings.

Figure 1A:
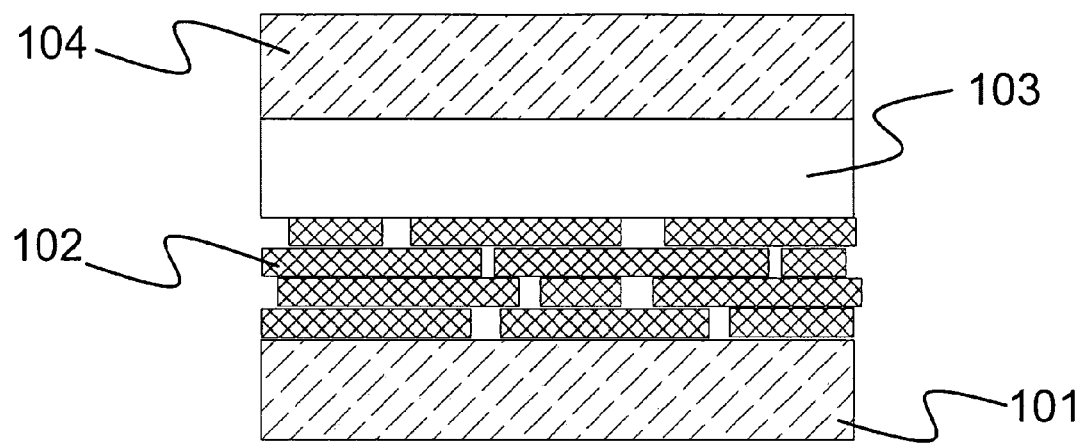
FIGS. 1a to 1c show devices according to embodiments of the present invention.
Figure 1B:
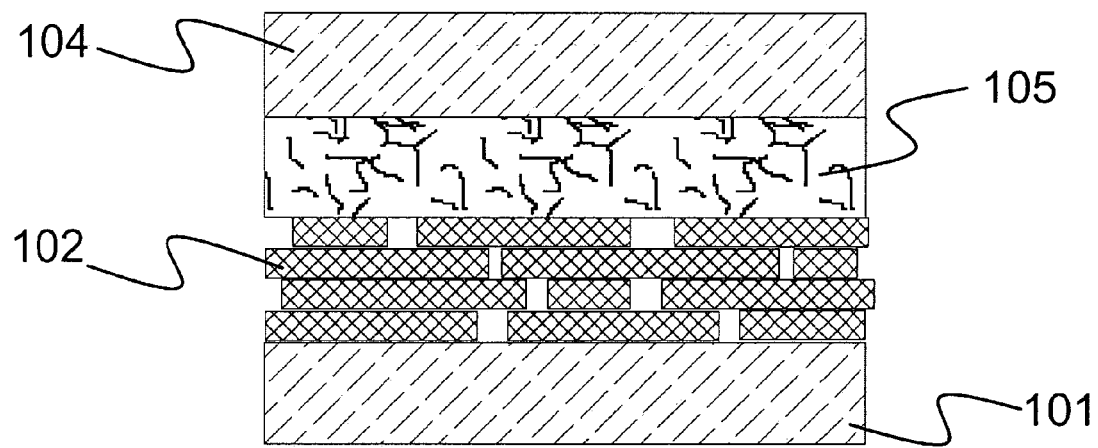

FIG. 1a shows a device according to an embodiment of the present invention. It is clear to a skilled person that the device shown in this figure is an exemplary implementation of the present invention, and the claimed device is not limited to the structure shown herein. The device may be a memristor or another variable resistance device. The device comprises a first electrode 101 which can be made of any appropriate conductive material, for example a metal. The first electrode 101 may be a planar electrode, a wire or any other appropriate type of an electrode. In this implementation, the switching region 102 is positioned on top of the first electrode. The switching region 102 is in electrical contact with the first electrode 101. The switching region 102 is shown as a stack of materials, which can be, for example, few-layer materials such as few-layer transition metal dichalcogenides (TMD), few-layer transition metal oxides (TMO), few-layer TMD-TMO composites (mixtures of sulfides and oxides, sulfoxides, selenoxides, telluroxides, etc) and other graphene-like materials. Few-layer materials may demonstrate high anisotropy in electrical properties due to the large difference of intra- and interlayer bonding. These materials may comprise a plurality of defects such as structural defects, pores and cavities, as schematically shown by spaces in the layers of materials in the switching region 102. When constructed in a single- or few-layer form, materials may experience defect generation, especially at the edge of crystals, resulting in highly active nonstoichiometric areas. For example oxygen, sulfur, selenium or tellurium anions (or equivalently positively charged vacancies) can act as mobile species and thus anionic motion can lead to valence change of the metal, which causes the resistance change of the material. The defects may also be responsible for charge trapping and de-trapping providing an alternative mechanism of resistance switching.

The device further comprises an intermediate region 103 and a second electrode 104. The intermediate region 103 is in electrical contact with the second electrode 104 and the switching region 102. The intermediate region 103 can comprise, for example, metal nanowires, or a variety of conducting polymers (described above), composite polymers with different conductive fillers such as Carbon Nanotubes, graphene, graphite, metal particles etc. In an exemplary implementation of the device shown in FIG. 1b, the intermediate region comprises metal nanowires 105 embedded in an insulating polymer matrix. The intermediate region of FIG. 1b can be in electrical contact with the second electrode 104 and with the switching region 102 via one or more electrical contact points. These contact points can be provided via sporadic physical contact or proximity of the metal nanowires to the other regions. The intermediate region 103 may be advantageous in providing electrical contact with the switching region 102 and the second electrode 104, while at the same time preventing unwanted electrical contact between the first 101 and the second electrode 104.

Typically, a variable resistance device (such as a memristor) is built from a metal/insulator/metal or metal/semiconductor/metal thin-film stack. Due to the nature of some insulators that exhibit memristive properties, the bottom and top electrodes might be shorted in conventional devices, which can potentially render the device unusable. This risk is even more significant when few-layer materials are used in the switching region 102. The intermediate region 103 can prevent this unwanted electrical contact between the electrodes 101 and 104. For example, metal nanowires embedded in polymer matrix can act as a separator that partially fills the pores and cavities in proximity of the interface between the intermediate and the switching regions with insulating polymer, and provides sporadic electrical contacts by nanowires which support ionic motion channels at nanoscale. Therefore, with the intermediate region 103 (for example, comprising metal nanowires 105) unwanted connection between the electrodes of the device is unlikely, and the performance of the device is improved at the same time. According to an embodiment, the intermediate region may be used for tuning of the Schottky barrier properties at the interface between semiconductor and metal.

Figure 1C:
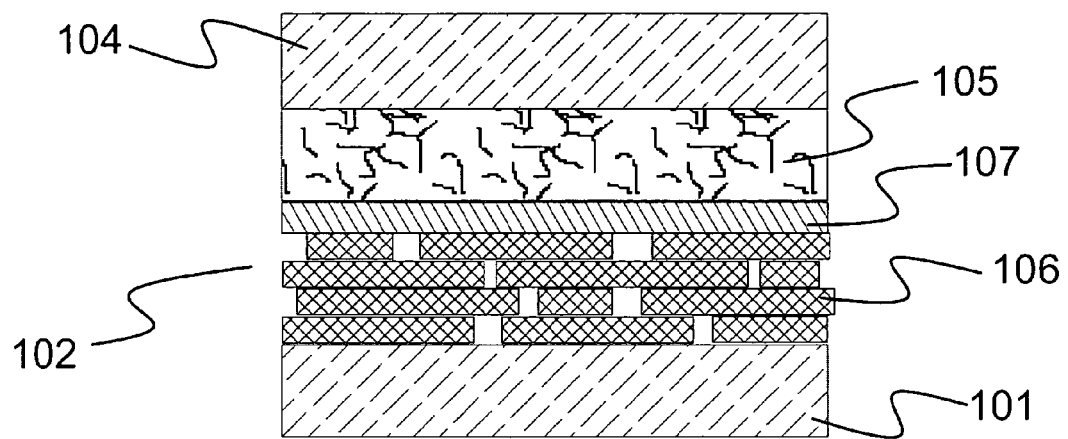

FIG. 1c shows a device according to an embodiment of the present invention. The device may be a memcapacitor or another variable capacitance device. The structure of the device shown on FIG. 1c can be similar to the structure of the device shown on FIG. 1b with the exception of the switching region 102, and like elements are indicated with like references. The switching region 102 of the device comprises a conductive material 106 and an insulating material 107. The insulating material 107 may be positioned so that it is in physical contact with the intermediate region 105. For example, the insulating material 107 may be comprised in the top layers of the switching region 102.

The conductive material 106 may comprise conductive transition metal dichalcogenides (TMD), transition metal oxides (TMO) and graphene-like materials. The insulating material may comprise insulating TMD, TMO and graphene-like materials. The TMD may be any of $WX_2$, $MoX_2$, $ScX_2$, $TiX_2$, $HfX_2$, $ZrX_2$, $VX_2$, $CrX_2$, $MnX_2$, $FeX_2$, $CoX_2$, $NiX_2$, $NbX_2$, $TcX_2$, $ReX_2$, $PdX_2$, $PtX_2$ wherein X is S, Se or Te. The TMO may be any of $WO_n$, $MoO_n$, $ScO_n$, $TiO_n$, $HfO_n$, $ZrO_n$, $VO_n$, $CrO_n$, $MnO_n$, $FeO_n$, $CoO_n$, $NiO_n$, $NbO_n$, wherein n is 2 or 3. Graphene-like materials may be any of: graphene oxide, h-BN, AlN, GaN, InN, InP, InAs, BP, BAs, and GaP.

The thickness of the conductive material may vary from 1 nm to 1000 nm.

The thickness of the insulating material may vary from 1 nm to 20 nm.

The switching region 102 can be partially oxidized, and the oxidized part of the switching region can comprise the insulating material 107, while the remaining part of the switching region can comprise the conducting material 106. In an embodiment, material in the top part of the switching region 102 which is physical contact or proximity to the intermediate region can be oxidized and form the insulating part 107, while the non-oxidized material below can form the conductive part 106.

The intermediate region of the device shown on FIG. 1c can comprise nanowires 105 embedded in an organic material. Similarly to the embodiment shown on FIG. 1b, the intermediate region can be in electrical contact with the second electrode 104 and with the switching region 102 via one or more electrical contact points. In the illustrated example, the intermediate region is in contact with the insulating material 107 of the switching region 102. The contact points can be provided via sporadic physical contact or proximity of the nanowires 105 to the other regions. The nanowires 105 embedded in an organic material can act as a top plate of a variable capacitance device. The use of nanowires allows scaling down the effective size of the memcapacitor for better control over the switching process.

Capacitive property of the device is supported by the insulating material stacked between conducting electrodes. The device has a non-linear capacitance with respect to the voltage applied across the electrodes 104, 101. A memory effect originates from changes in permittivity under the external electric field. Electrically-induced ion motion can cause a change of the dielectric constant of the insulating material and thus supports multistate capacitive switching. Nanoionic transport can be fueled by the nature of the materials with intrinsic anion vacancies. When a voltage is applied to the electrodes 101, 104 the electric field can cause the ion motion which changes the permittivity of the insulating material 107 leading to virtual propagation of e.g. the first electrode 101 towards the second 104. Other switching mechanisms based on physical processes such as carrier charge trapping/detrapping can also be achieved. Memcapacitive and memristive effects may appear simultaneously, for example at nanoscale. In this case capacitive switching and resistive switching may be associated with the same state variables.

A classical approach to memristor fabrication usually requires a high-precision mask alignment and an involvement of high temperatures and low vacuum processes. With the growth of printed electronics industry aligned with the advantages of reducing manufacturing costs, there is a need for solution-processable materials and low-cost technologies that can be applied to manufacturing of memristor arrays.

Figure 2:
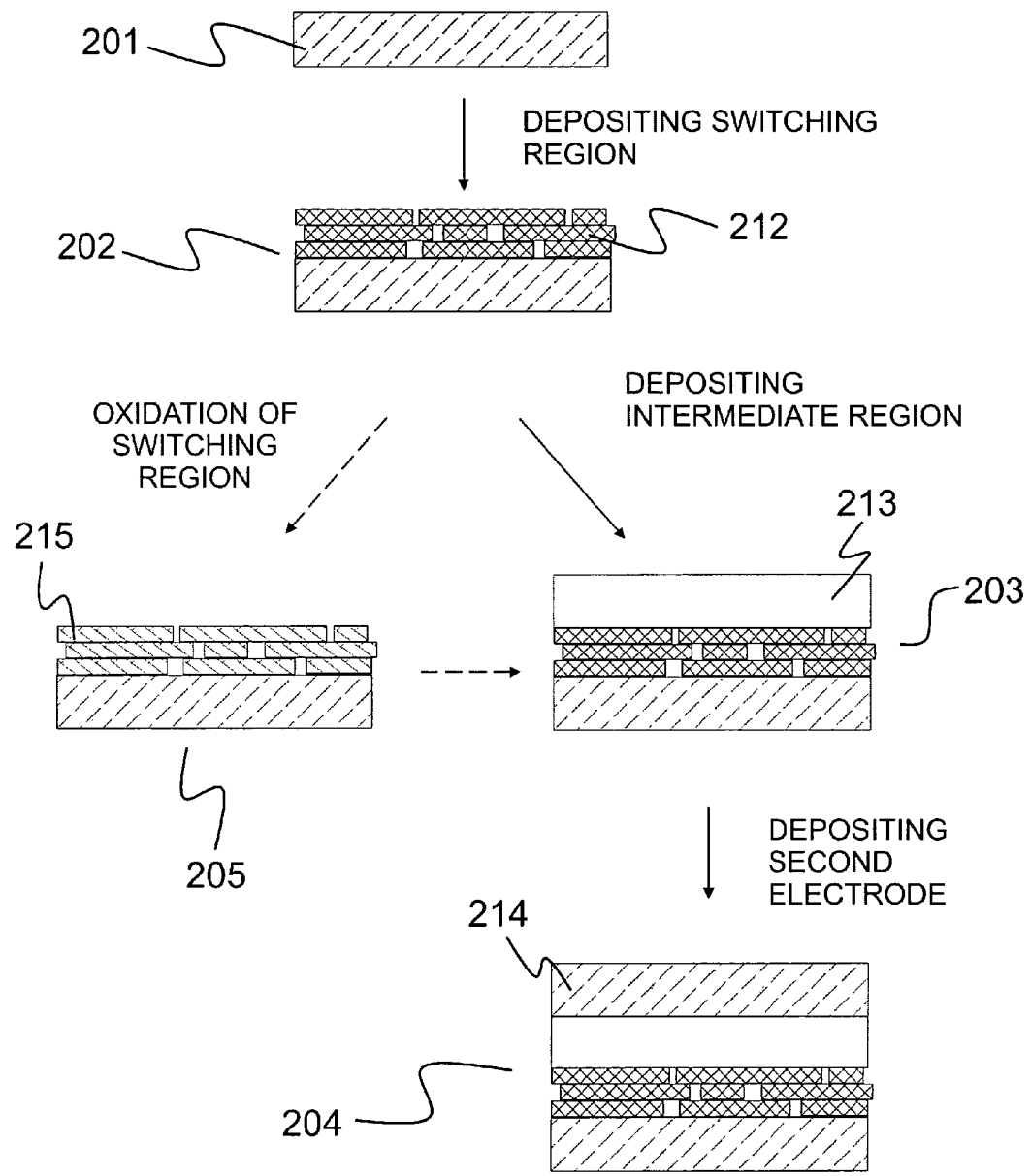
FIG. 2 shows a method according to an embodiment the present invention.

FIG. 2 shows a method according to an embodiment of the present invention. This method is suitable for production or fabrication of variable resistance devices such as memristors and variable capacitance devices such as memcapacitors. According to the method, a first electrode 201 is provided. It can be deposited on a substrate (not shown) by any suitable technique such as dispensing, screen printing, offset printing, gravure printing, flexography, slot-die coating, inkjet printing, chemical vapor deposition (CVD) and sputtering; or the electrode 201 can be pre-manufactured. A switching region 212 is then deposited onto the electrode, resulting in a structure 202 with one electrode and an exposed switching region 212. The switching region 212 may be deposited by different techniques such as spray-coating, slot-die coating, inkjet printing, thin film transfer, CVD and others. The switching region 212 can comprise a variety of different materials, as described in the embodiments above. The method of FIG. 2 further comprises depositing an intermediate region 213 onto the switching region 212, which results in a structure 203. The intermediate region 213 can be deposited by any suitable technique such as dispensing, drop-casting, screen printing, offset printing, gravure printing, flexography, inkjet printing, etc. Then, a second electrode 214 is deposited by any suitable technique, resulting in the final structure 204. In an alternative embodiment, the intermediate region may be deposited onto the first electrode, and deposition of the switching region and the second electrode may follow.

The method according to the present invention may include an additional step of partial or full oxidation of the materials of the switching region. After the oxidation is performed, the intermediate region 213 is deposited onto a partially or fully oxidized switching region 215 of the structure 205 and the method continues similarly to the embodiment described above. A variety of oxidation techniques can be used including, but not limited to, thermal annealing, laser, plasma, and xenon flash lamp treatment. The gaseous atmosphere of the oxidation can be, for example air, oxygen, ozone or a mixture of an inert gas with oxygen. Ozone atmosphere may enhance the rate and the degree of oxidation during the treatment. Masking may also be used during oxidation in any of the above gaseous atmospheres.

A less conductive oxide layer may be formed at the interface of the switching region 212 by oxidation, which allows improving the electronic switching properties of the resulting device. The partial or full oxidation of materials may also significantly increase the number of defects in the material, which can be beneficial for producing enhanced ionic motion involving the oxygen anions. This allows using, for example, few-layer materials as anion-driven memristors wherein the resistance switching is governed by a variety of defects in the materials that alter electronic transport. While bulk material memristors often require forcible disturbance of stoichiometry in order to achieve sufficient ionic motion, few-layer materials may have natural defects due to their unique structure.

An insulating oxide layer may be formed at the interface of the switching region 212 by oxidation, which allows using the method in production of memcapacitors. Alternatively, deposition of the switching region may comprise depositing on a conductive material first and then depositing an insulating material on top of the conductive material e.g. by vacuum techniques or printing methods. This also allows production of variable capacitance devices by the method.

"Memristance", or memristive property, can be expressed as a charge-dependent rate of magnetic flux $\varphi$ with charge q by the following formula $M(q)=d\varphi/dq$. Due to the fact that voltage V is a time function of magnetic flux and current I is a time function of charge, the following expression can be obtained: $M(q(t))=V(t)/I(t)$. This shows that memristance is essentially a charge-dependent resistance. With little changes in $M(q(t))$ under pulsating current conditions the memristor may behave as a resistor. Usually, three main properties of a memristor are considered: 1—pinched I-V (current-voltage) hysteresis loop; 2—hysteresis lobe area decrease with increase in frequency; and 3—hysteresis loop shrinks to a single-valued function at infinite frequency. The devices described in the following examples are memristors based on few-layer $WS_2$ and $MoS_2$ with a metal nanowire interlayer, deposited by different methods and at different conditions. According to a first exemplary implementation of the method, the first electrodes used in these examples were planar gold electrodes. $WS_2$ and $MoS_2$ flakes dispersed in ethanol solution were spray-coated over the electrode at different temperatures (150° C., 250° C. and 400° C.), and then dried in vacuum. The lateral size of $WS_2$ flakes was 50-150 nm, the thickness was 1-4 monolayers. The lateral size of $MoS_2$ flakes was 100-400 nm, the thickness was 1-8 monolayers. The overall thickness of the switching region was in the range of 50-300 nm. Then, an intermediate region of silver nanowires (NW) dispersed in an organic media was drop-casted. The top electrode was printed using a silver paste. According to the second exemplary implementation of the method, the first electrode was fabricated by screen printing or inkjet printing of silver ink on a polyethylene naphthalate (PEN) substrate. The $WS_2$ and $MoS_2$ thin films were deposited over the electrode by a spreading technique, in particular a modified Langmuir-Blodgett method, where the inorganic film is collected at a polar-nonpolar liquid interface by mixing and then, utilizing a tendency of the interface film to spread or cover any available area, it was transferred to the plastic foil with the printed electrode. The film transfer procedure can be repeated 2-10 times depending on the required film thickness. The overall thickness of the switching region was in the range of 30-300 nm. Then the films were dried in vacuum and annealed at 180-200° C. for 3 hours in air. This led to the formation of an ultrathin oxide layer (~2-10 nm) at the top surface of the film, resulting in $WS_2/WO_x$ (x<3) and $MoS_2/MoO_x$ (x<3) films, respectively. Then, an intermediate region of silver nanowires (NW) dispersed in an organic media was drop-casted. The top electrode was screen printed using a silver paste.

Figure 3A:
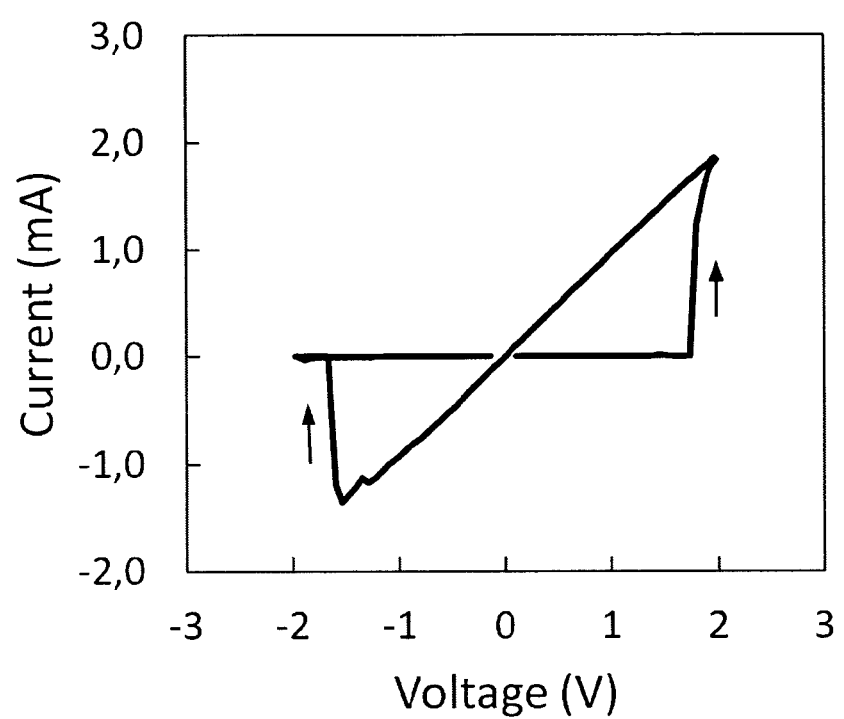
FIGS. 3a to 3c are graphs of Current against Voltage for devices according to exemplary embodiments of the present invention.
Figure 3B:
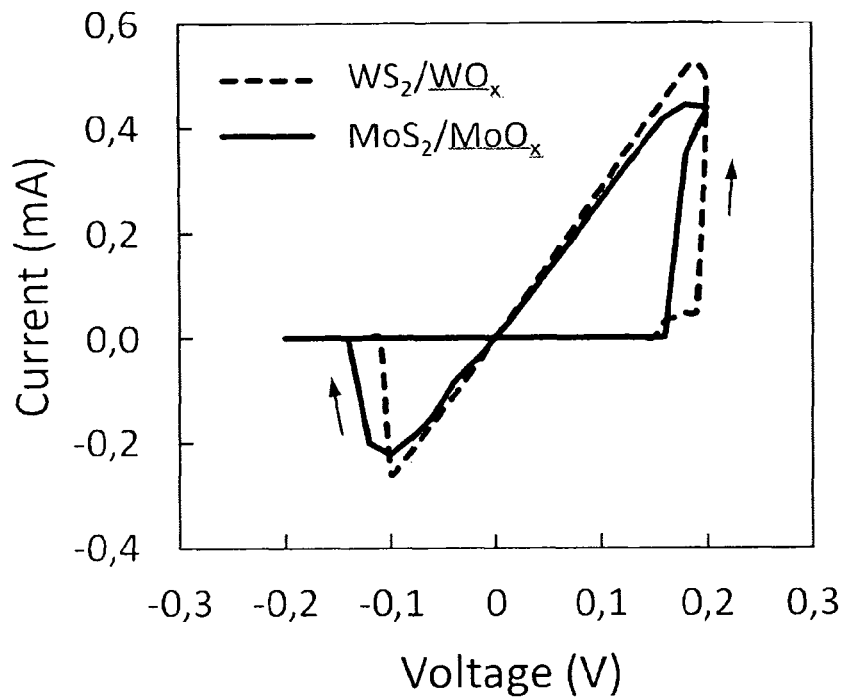
Figure 3C:
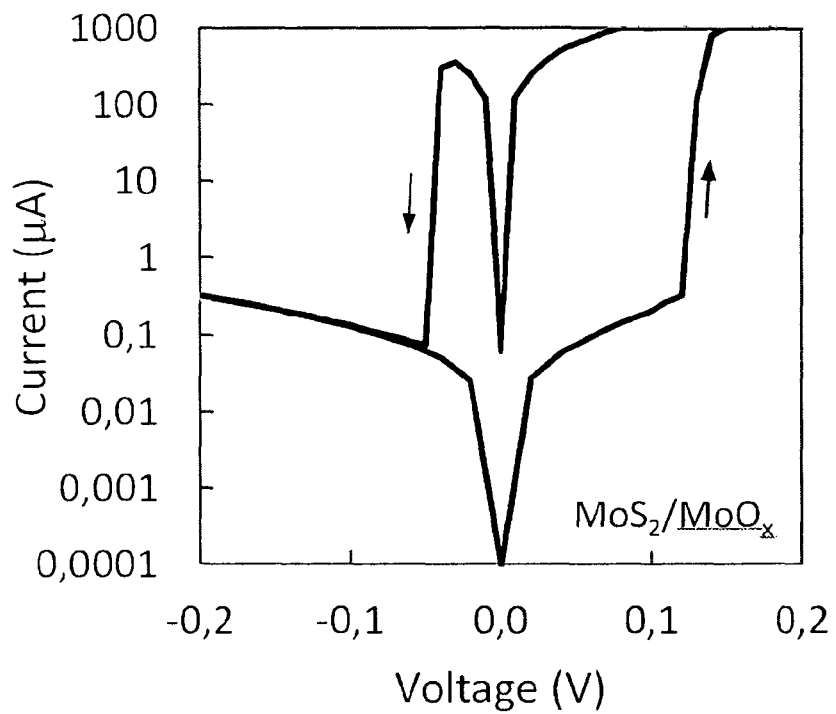

FIGS. 3a to 3c are graphs of current against voltage for the example devices. The materials are called herein $WS_2/WO_x$ (x<3) instead of $WS_2/WO_3$ and $MoS_2/MoO_x$ (x<3) instead of $MoS_2/MoO_3$ because the stoichiometry may not be accurate for few-layer materials in a deficient phase. FIG. 3a shows I-V characteristics of the few-layer $MoS_2/MoO_x$ memristor deposited by spray-coating at 250° C. with a silver nanowires intermediate layer. FIG. 3b shows I-V characteristics of the few-layer $MoS_2/MoO_x$ memristor deposited by the spreading technique at room temperature, and FIG. 3c shows the few-layer $WS_2/WO_x$ memristor deposited by the spreading technique at room temperature. The few-layer stacks exhibit a typical hysteresis loop of I-V curve at positive and negative direct current (DC) voltages. The threshold voltage of below 2 V along with high resistance change of up to $10^6$ can be beneficial for the purposes of ultra-low power electronics.

One application of memristors is their function as an analogue of a biological synapse where the strength of the synaptic connection can be precisely changed to perform information processing, learning and memorization in accordance with pre-synaptic and post-synaptic neuron actions. Similarly to synapse terminology, two types of memristor plasticity can be identified: short-term plasticity (STP), in which the changes in resistance last for only seconds and then the memristor returns to the original state, and long-term plasticity (LTP), in which the resistance change can last from hours to years. Memristance is managed by the pulse amplitude, the number of pulses, and input frequency, which all cumulatively change the "synaptic weight" of memristor.

Figure 4A:
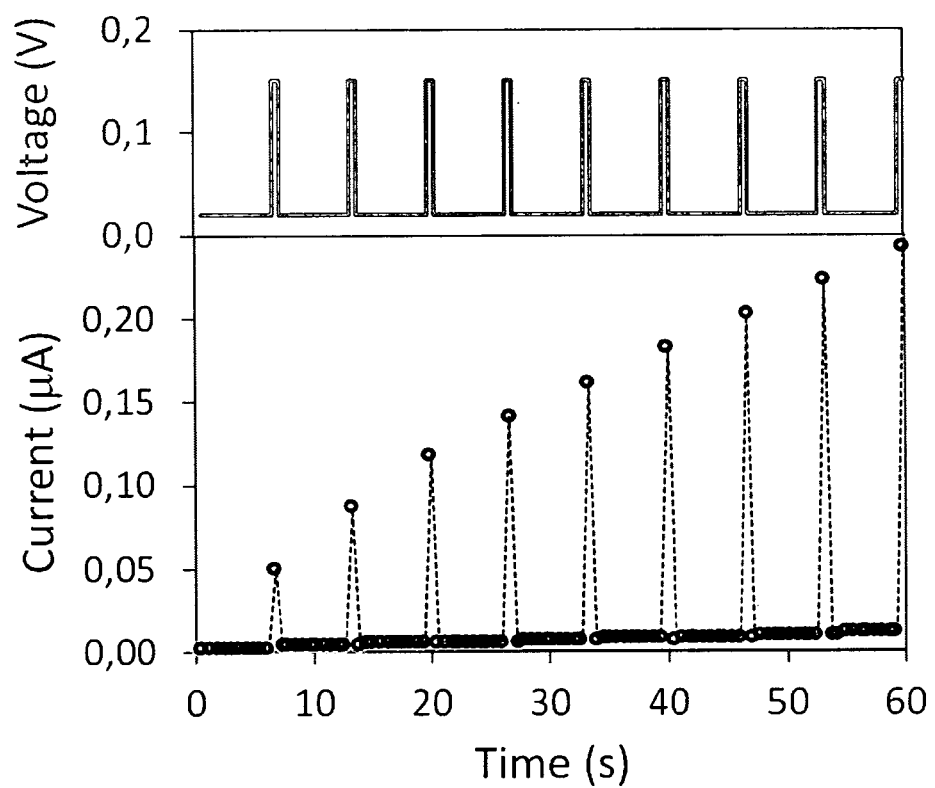
FIGS. 4a to 4b are graphs of Current against Time for $MoS_2/MoO_x$ and $WS_2/WO_x$ based memristors according to an exemplary embodiment of the present invention.
Figure 4B:
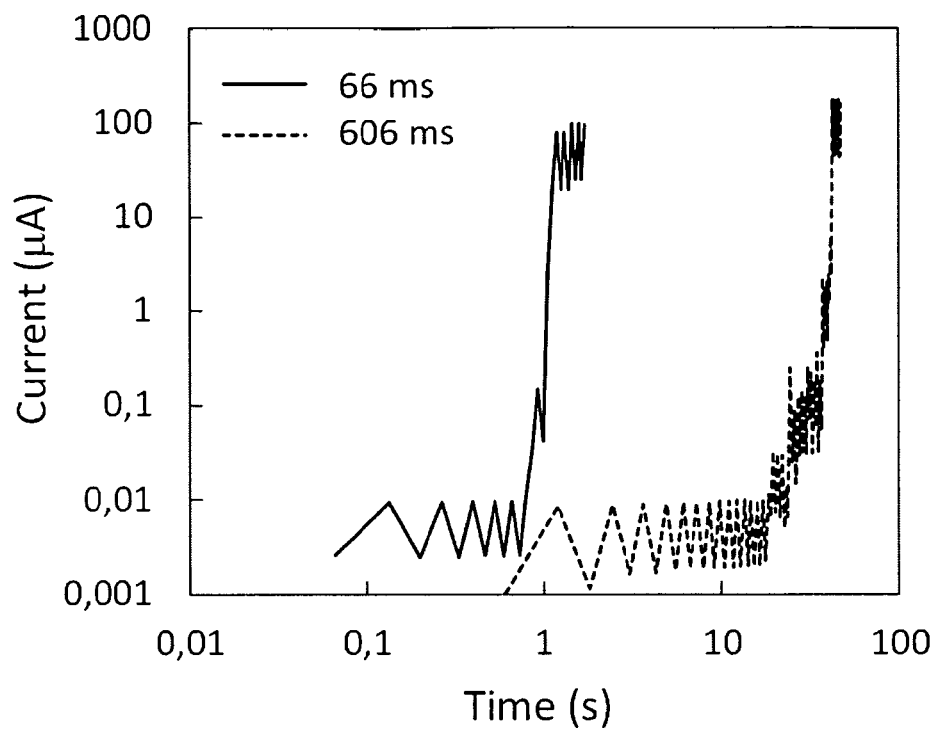

FIGS. 4a and 4b are current-time graphs that show resistance switching behavior and memorization of $MoS_2/MoO_x$ and $WS_2/WO_x$ based memristors fabricated by the spreading technique and spray-coating, respectively. FIG. 4a illustrates STP of $MoS_2/MoO_x$ memristor obtained by applying a train of electric pulses with amplitude of 150 mV for 606 ms with a pulse interval of about 6 s, with the base voltage of 50 mV. FIG. 4b shows LTP obtained for the $WS_2/WO_x$ memristor by applying a sequence of electric pulses with amplitude of 200 mV for 66 ms with a pulse interval of 66 ms (solid curve) and 606 ms with a pulse interval of 606 ms (dashed curve), the base voltage was 50 mV. As shown in these Figures, the memristive devices possess both STP and LTP properties when the interval between pulses varies. Low-frequent pulsed DC voltage decreases the resistance temporary while high-frequent DC voltage leads to long-term potentiation.

Figure 5:
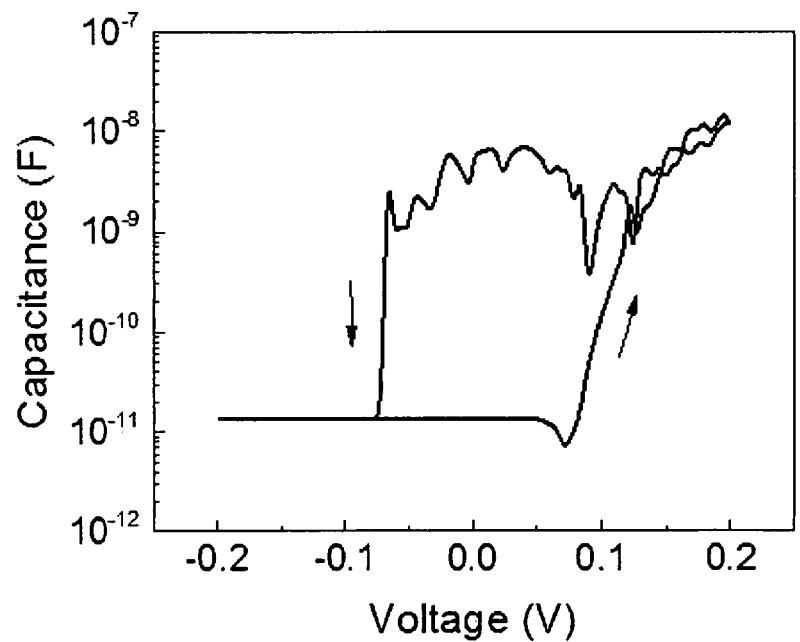
FIG. 5 is a graph of Capacitance against Voltage for a $MoS_2/MoO_x$ device.

FIG. 5 shows capacitance against voltage for $MoS_2/MoO_x$ device with a silver nanowire interlayer. In this example, memcapacitive switching is demonstrated by the capacitance change as a function of the applied voltage. The C-V profile shows a clear hysteresis loop which indicates an existence of the memory effect. The capacitive contribution is calculated from the impedance spectroscopy via biasing a small 10 mV AC signal with the frequency sweeping from 1 Hz to 1 MHz. The C-V curve is extracted from the impedance measurements with 10 mV 1 kHz AC signal superimposed on a continuous DC bias sweep.

An apparatus in accordance with the invention may include at least one processor in communication with a memory or memories. The processor may store, control, add and/or read information from the memory. The memory may comprise one or more computer programs which can be executed by the processor. The processor may also control the functioning of the apparatus. The processor may control other elements of the apparatus by effecting control signaling. The processor may, for example, be embodied as various means including circuitry, at least one processing core, one or more microprocessors with accompanying digital signal processor(s), one or more processor(s) without an accompanying digital signal processor, one or more coprocessors, one or more multi-core processors, one or more controllers, processing circuitry, one or more computers, various other processing elements including integrated circuits such as, for example, an application specific integrated circuit (ASIC), or field programmable gate array (FPGA), or some combination thereof. Signals sent and received by the processor may include any number of different wireline or wireless networking techniques.

The memory can include, for example, volatile memory, non-volatile memory, and/or the like. For example, volatile memory may include Random Access Memory (RAM), including dynamic and/or static RAM, on-chip or off-chip cache memory, and/or the like. Non-volatile memory, which may be embedded and/or removable, may include, for example, read-only memory, flash memory, magnetic storage devices, for example, hard disks, floppy disk drives, magnetic tape, etc., optical disc drives and/or media, non-volatile random access memory (NVRAM), and/or the like. If desired, the different functions discussed herein may be performed in a different order and/or concurrently with each other. Furthermore, if desired, one or more of the above-described functions may be optional or may be combined.

Although various aspects of the invention are set out in the independent claims, other aspects of the invention comprise other combinations of features from the described embodiments and/or the dependent claims with the features of the independent claims, and not solely the combinations explicitly set out in the claims.

It is also noted herein that while the above describes example embodiments of the invention, these descriptions should not be viewed in a limiting sense. Rather, there are several variations and modifications which may be made without departing from the scope of the present invention as defined in the appended claims.

What is claimed is:

1. A device, comprising:
   a first electrode;
   a second electrode spaced from the first electrode;
   a switching region positioned between the first electrode and the second electrode, the switching region comprising one or more materials; and
   an intermediate region positioned between the switching region and the second electrode, wherein the intermediate region is in electrical contact with the switching region and the second electrode;
   wherein the switching region comprises a conductive material and an insulating material, wherein the insulating material is in physical contact with the intermediate region and is positioned between the conductive material comprised by the switching region and the intermediate region, and wherein the device is a variable capacitance device.

2. The device of claim 1, wherein the device is a memristor.

3. The device of claim 1, wherein the switching region is in electrical contact with the first electrode via physical contact with the first electrode, and in electrical contact with the second electrode via physical contact with the intermediate region.

4. The device of claim 1, wherein the switching region has a thickness between 10 and 1000 nanometers.

5. The device of claim 1, wherein the intermediate region comprises: metal nanowires, polymers or a combination thereof.

6. The device of claim 1, wherein the intermediate region is in electrical contact with the second electrode and with the switching region via one or more electrical contact points.

7. The device of claim 1, wherein the elements of the device are arranged to form a vertical stack.

8. The device of claim 1, wherein the insulating material comprises a material selected from the group of: insulating transition metal dichalcogenides, transition metal oxides and graphene-like materials.

9. The device of claim 1, wherein the conductive material comprises a material selected from the group of: conductive transition metal dichalcogenides, transition metal oxides and graphene-like materials.

10. The device of claim 1, wherein the switching region is partially oxidized, and wherein the oxidized part of the switching region comprises the insulating material, and the remaining part of the switching region comprises the conductive material.

11. The device of claim 10, wherein the oxidized part of the switching region is at least partially in physical contact with the intermediate region.

12. The device of claim 1, wherein the intermediate region comprises nanowires embedded in an organic material.

13. The device of claim 12, wherein the intermediate region is in electrical contact with the second electrode and with the insulating material of the switching region via one or more electrical contact points.

14. A method of fabricating a variable capacitance device, comprising:
   providing a first electrode;
   depositing on the first electrode a switching region comprising one or more materials;
   depositing on the switching region an intermediate region comprising at least one of metal nanowires or polymers; and
   depositing on the intermediate region a second electrode;
   wherein depositing the switching region comprises depositing on the first electrode a conductive material and depositing on the conductive material an insulating material, wherein the insulating material is deposited such that the insulating material is in physical contact with the intermediate region and is positioned between the conductive material comprised by the switching region and the intermediate region.

15. The method of claim 14, further comprising providing a substrate, wherein the first electrode is provided by depositing said first electrode on the substrate.

16. The method of claim 14, wherein the intermediate region comprising metal nanowires and/or polymers is deposited on the switching region by at least one of dispensing, drop-casting, screen printing, offset printing, gravure printing, flexography, or inkjet printing.

17. The method of claim 14, wherein the first and second electrodes are deposited by at least one of the following deposition techniques: sputtering, chemical vapor deposition (CVD), physical vapor deposition (PVD) and printing.

18. An apparatus for forming a variable capacitance device, the apparatus, comprising:
- at least one processor; and
- at least one memory coupled to the at least one processor, the at least one memory comprising program code instructions which, when executed by the at least one processor, cause the apparatus to:
- provide a first electrode;
- deposit on the first electrode a switching region comprising one or more materials;
- deposit on the switching region an intermediate region comprising metal nanowires and/or polymers; and
- deposit on the intermediate region a second electrode in order to form a variable capacitance device;
- wherein depositing the switching region comprises depositing on the first electrode a conductive material and depositing on the conductive material an insulating material, wherein the insulating material is deposited such that the insulating material is in physical contact with the intermediate region and is positioned between the conductive material comprised by the switching region and the intermediate region.

* * * * *